(12) United States Patent
Sharma

(10) Patent No.: US 11,751,402 B2
(45) Date of Patent: Sep. 5, 2023

(54) FERROELECTRIC CAPACITORS WITH BACKEND TRANSISTORS

(71) Applicant: INTEL CORPORATION, Santa Clara, CA (US)

(72) Inventor: Abhishek A. Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 285 days.

(21) Appl. No.: 16/636,199

(22) PCT Filed: Sep. 29, 2017

(86) PCT No.: PCT/US2017/054603
§ 371 (c)(1),
(2) Date: Feb. 3, 2020

(87) PCT Pub. No.: WO2019/066967
PCT Pub. Date: Apr. 4, 2019

(65) Prior Publication Data
US 2020/0373312 A1 Nov. 26, 2020

(51) Int. Cl.
*H10B 53/30* (2023.01)
*G11C 7/18* (2006.01)
(Continued)

(52) U.S. Cl.
CPC ............. *H10B 53/30* (2023.02); *G11C 7/18* (2013.01); *G11C 8/14* (2013.01); *G11C 11/221* (2013.01);
(Continued)

(58) Field of Classification Search
CPC ......... H01L 27/11507; H01L 29/42384; H01L 28/55; H01L 27/1255; G11C 7/18;
(Continued)

(56) References Cited

U.S. PATENT DOCUMENTS 10,868,132 B2 * 12/2020 Lee .................... H01L 29/7839
2002/0125517 A1 9/2002 Nakamura
(Continued)

FOREIGN PATENT DOCUMENTS

JP H05 159585 6/1993
JP 2008300376 A 12/2008
(Continued)

OTHER PUBLICATIONS

Search Report from European Patent Application No. 17927065.7 dated Mar. 17, 2021, 8 pgs.
(Continued)

*Primary Examiner* — Jerome Leboeuf
(74) *Attorney, Agent, or Firm* — Schwabe, Williamson & Wyatt, P.C.

(57) ABSTRACT

An integrated circuit includes a backend thin-film transistor (TFT) a ferroelectric capacitor electrically connected to the backend TFT. The backend TFT has a gate electrode, source and drain regions, a semiconductor region between and physically connecting the source and drain regions, and a gate dielectric between the gate electrode and semiconductor region. The ferroelectric capacitor has a first terminal electrically connected to one of the source and drain regions, a second terminal, and a ferroelectric dielectric between the first and second terminals. In an embodiment, a memory cell includes this integrated circuit, the gate electrode being electrically connected to a wordline, the source region being electrically coupled to a bitline, and the drain region being the one of the source and drain regions. In an embodiment, an embedded memory includes wordlines, bitlines, and a plurality of such memory cells at crossing regions of the wordlines and bitlines.

20 Claims, 11 Drawing Sheets

(51) Int. Cl.
  *G11C 8/14* (2006.01)
  *G11C 11/22* (2006.01)
  *H01L 29/423* (2006.01)

(52) U.S. Cl.
  CPC ...... *G11C 11/223* (2013.01); *H01L 29/42384* (2013.01)

(58) Field of Classification Search
  CPC ....... G11C 8/14; G11C 11/221; G11C 11/223; H10B 53/30
  See application file for complete search history.

(56) References Cited

U.S. PATENT DOCUMENTS

| | | |
|---|---|---|
| 2003/0030084 A1 | 2/2003 | Moise et al. |
| 2007/0131994 A1 | 6/2007 | Sawasaki |
| 2012/0003808 A1 | 1/2012 | Lee |
| 2013/0264620 A1 | 10/2013 | Yu et al. |
| 2015/0194475 A1* | 7/2015 | Kawashima ........ H01L 51/5012 257/43 |
| 2016/0051910 A1 | 2/2016 | Schunk et al. |
| 2017/0018655 A1* | 1/2017 | Okazaki ............ H01L 29/78696 |
| 2017/0162678 A1* | 6/2017 | Yim ...................... H01L 21/467 |
| 2017/0207225 A1 | 7/2017 | Mueller et al. |
| 2018/0102365 A1* | 4/2018 | Van Houdt ......... H01L 21/8254 |
| 2021/0391472 A1* | 12/2021 | Tsai ..................... H01L 29/516 |

FOREIGN PATENT DOCUMENTS

| | | |
|---|---|---|
| JP | 4818255 | 11/2011 |
| WO | 2019066967 A1 | 4/2019 |

OTHER PUBLICATIONS

International Preliminary Report on Patentability received for PCT Application No. PCT/US2017/054603, dated Apr. 9, 2020. 8 pages.
International Search Report and Written Opinion received for PCT Application No. PCT/US2017/054603, dated Jun. 29, 2018. 11 pages.

* cited by examiner

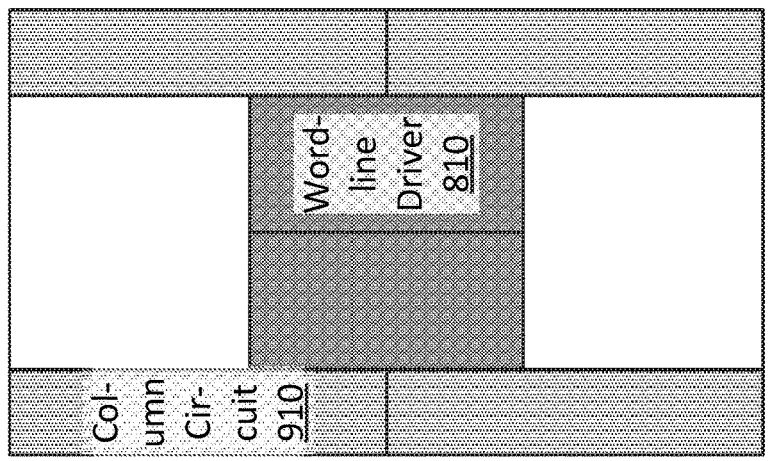
FIG. 9C
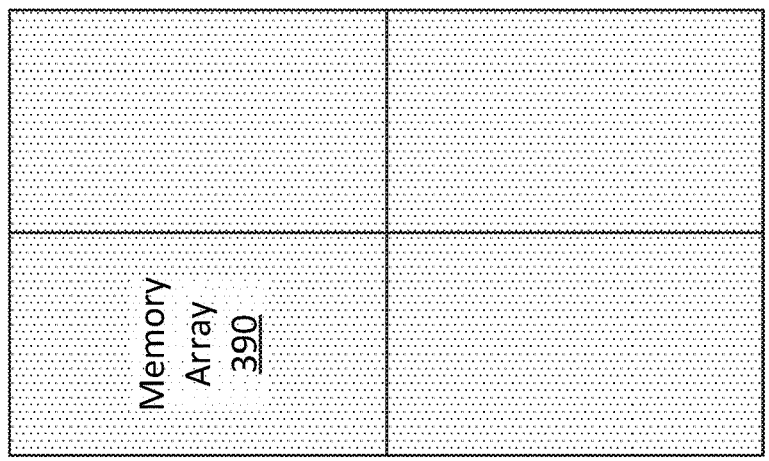
FIG. 9B
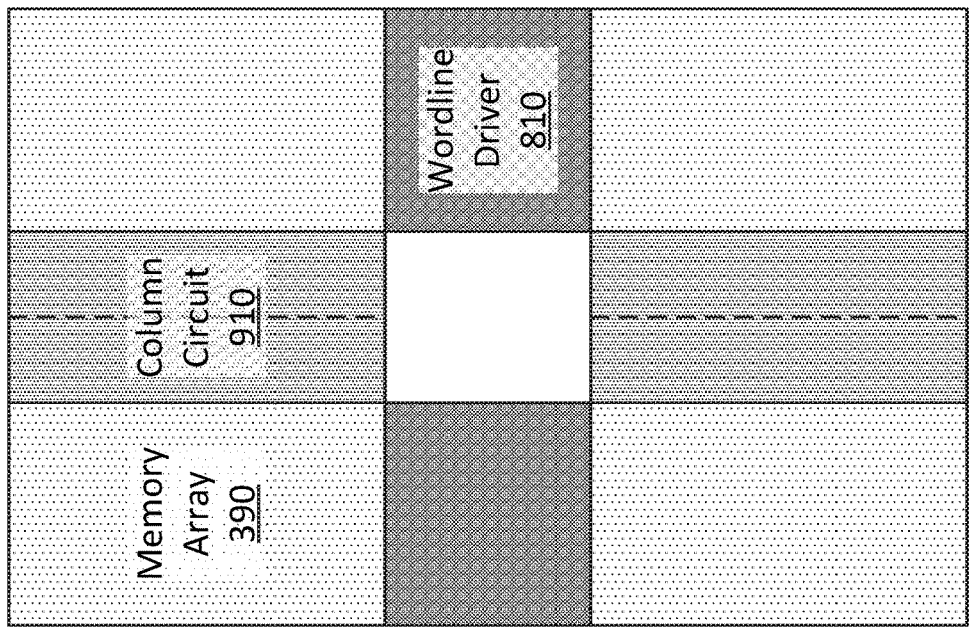
FIG. 9A
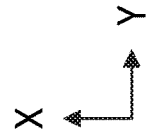

FERROELECTRIC CAPACITORS WITH BACKEND TRANSISTORS

CROSS REFERENCE TO RELATED APPLICATIONS

This application is a U.S. national stage entry under 35 U.S.C. § 371(c) of International Application No. PCT/US17/54603, filed Sep. 29, 2017, the disclosure of which is incorporated by reference herein in its entirety.

BACKGROUND

Embedded dynamic random-access memory (eDRAM) and embedded static RAM (eSRAM) are commonly tied to a silicon front-end process. Accordingly, such memories consume a significant amount of integrated circuit (IC) area because of factors such as transistor size and pitch limitations. Ferroelectric memory can be used as a nonvolatile DRAM and eDRAM replacement memory. Ferroelectric materials are attractive contenders for the dielectric structure of capacitors. However, with newer semiconductor process technologies, the dielectric structure area in integrated circuit capacitors (and hence, the total stored polarization charge) is reducing significantly. This makes ferroelectric capacitor scaling very challenging.

BRIEF DESCRIPTION OF THE DRAWINGS

FIG. 9A is a plan view of an example layout of an embedded memory without overlap of the memory array and memory peripheral circuit.

FIGS. 9B-9C are plan views of an example layout of an embedded memory with overlap of the memory array and memory peripheral circuit, according to an embodiment of the present disclosure.

DETAILED DESCRIPTION

Figure 1:
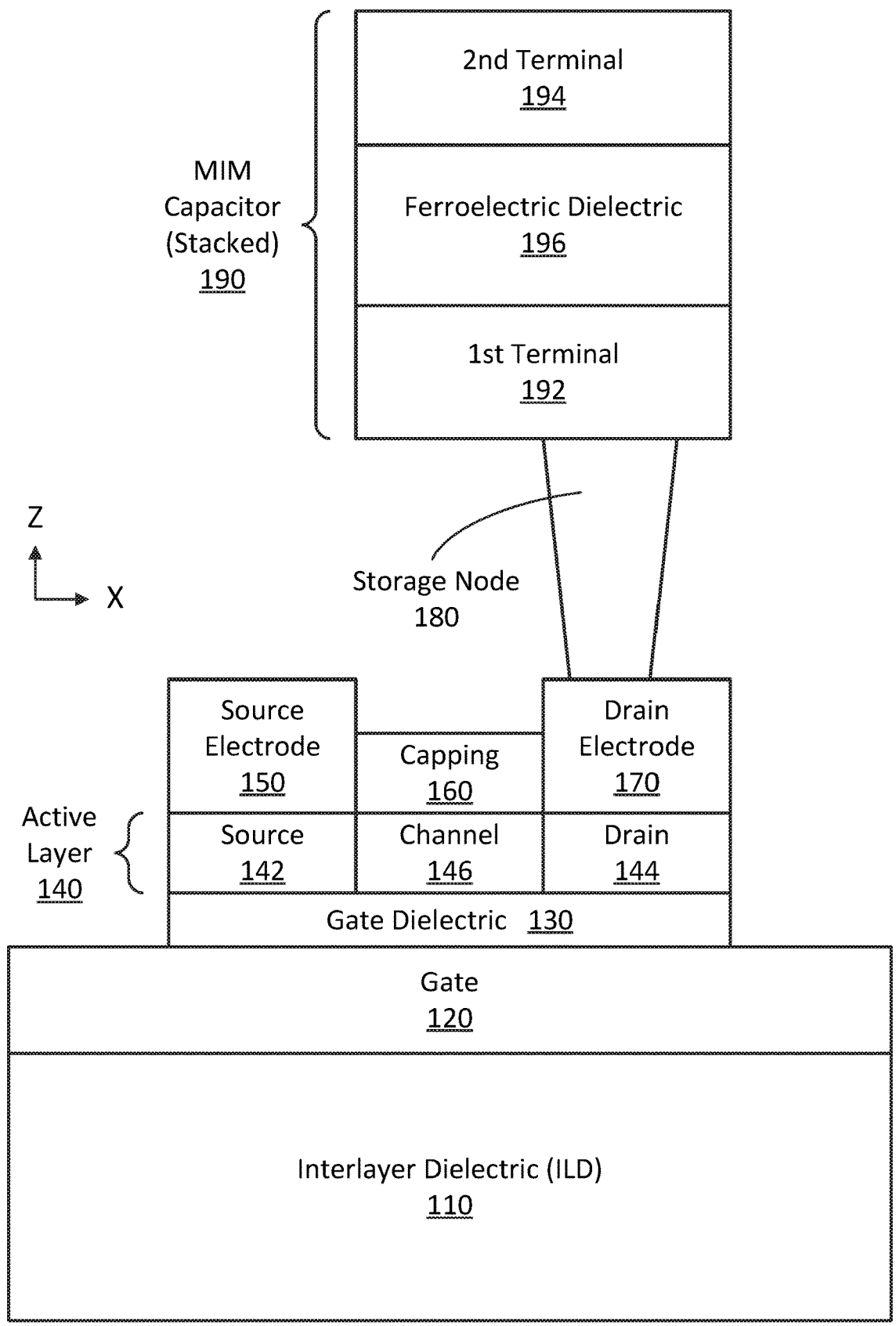
FIG. 1 is a cross-sectional view of an example integrated circuit including a stacked ferroelectric capacitor with a backend thin-film transistor (TFT), according to an embodiment of the present disclosure.

According to various embodiments of the present disclosure, an embedded one-transistor one-capacitor (1T1C) memory cell includes a ferroelectric capacitor that is electrically coupled to a backend transistor. An array of such memory cells can make up an embedded nonvolatile memory (eNVM). The backend transistor can be a thin-film transistor (TFT). The backend TFT can help with ferroelectric scaling, such as by improving the memory array efficiency due to the sensing peripherals (e.g., memory peripheral circuit) being able to be tucked under the backend TFT 1T1C array. In further detail, a ferroelectric material switches its polarization from a parallel to an antiparallel state (or vice versa). This change in the internal polarization is brought about at positive and negative voltages known as coercive voltages or fields. This introduces different amounts of polarization and polarity of charge inside the ferroelectric material. When used as the dielectric material in a capacitor, the switching of the ferroelectric material between the parallel and antiparallel states can be used to create a nonvolatile memory, such as an eNVM.

In one or more embodiments of the present disclosure, an integrated circuit is provided. The integrated circuit includes a backend thin-film transistor (TFT) and a ferroelectric capacitor on or otherwise in electrical connection with the backend TFT. The backend TFT, which can be, for example, on, electrically coupled to, or otherwise in electrical connection with a frontend circuit (such as a memory array controller), has a gate electrode, source and drain regions, a semiconductor region between and physically connecting the source and drain regions, and a gate dielectric between the gate electrode and the semiconductor region. The ferroelectric capacitor has a first terminal electrically connected to one of the source and drain regions, a second terminal, and a ferroelectric dielectric between the first and second terminals. In an embodiment, a memory cell includes this TFT-capacitor arrangement, with the gate electrode being electrically connected to a wordline, the source region being electrically connected to a bitline, and the drain region being the one of the source and drain regions. In another embodiment, an embedded memory includes a plurality of wordlines extending in a first direction, a plurality of bitlines extending in a second direction crossing the first direction, and a plurality of such memory cells at crossing regions of the wordlines and the bitlines.

General Overview

In accordance with some embodiments of the present disclosure, an eNVM memory cell includes a ferroelectric capacitor connected to a backend transistor, such as a backend TFT. The ferroelectric capacitor uses a ferroelectric material to store a bit (logical 1 or 0) in the eNVM. The reading of the memory cell can be destructive or nondestructive. The two different states (parallel or antiparallel) of the ferroelectric capacitor can be sensed, for example, on a bitline. For instance, by selecting the memory cell (e.g., using a unique combination of bitline and wordline, as driven by a control circuit such as a wordline driver), amplifying the bias (e.g., using a sense amplifier) imparted by the ferroelectric capacitor on the bitline, and comparing the amplified sensed bias to that of an unbiased bitline, the state of the ferroelectric capacitor (e.g., parallel or antiparallel) can be determined. Using a backend TFT, e.g., a TFT formed during a back end of line (BEOL) process, the front end of line (FEOL) process can be used to fabricate the memory controller (e.g., wordline drivers, sense amplifiers, and the like) logic underneath the memory array. This allows more room for the ferroelectric capacitors, which increases their corresponding capacitance, allowing them to continue to function as memory devices even with smaller process technologies, such as 10 nanometer (nm), 7 nm, 5 nm, and beyond.

In short, by using a ferroelectric capacitor electrically connected to a backend TFT to create a 1T1C eNVM memory cell, one or more embodiments of the present disclosure allow the memory cell array to be embedded in the upper metal layers of the interconnect (BEOL). This allows higher memory density and better performance and scalability. Put another way, by embedding the ferroelectric capacitor memory array in the upper BEOL interconnect using backend TFTs to create the memory cells, one or more embodiments of the present disclosure provide a feasible path to integrate ferroelectric capacitors in an advanced technology node, where the FEOL ferroelectric capacitor sizes would otherwise be a significant challenge. With the TFT-based ferroelectric capacitor eNVM, the memory array can be integrated in the higher metal layers where the design rules are relaxed and have less process change from generation to generation. This enables an easier path to integrate ferroelectric capacitors as memory devices to different process nodes.

Architecture and Methodology

FIG. 1 is a cross-sectional (X-Z) view of an example integrated circuit including a stacked ferroelectric capacitor 190 with backend thin-film transistor (TFT), according to an embodiment of the present disclosure. Throughout, the z-axis represents a vertical dimension (e.g., perpendicular to an integrated circuit substrate, while the x- and y-axes represent horizontal dimensions (e.g., parallel to the wordline and bitline directions, respectively). The components of FIG. 1 can be fabricated using semiconductor fabrication techniques, such as deposition and photolithography. The components of FIG. 1 can be part of a backend process, such as the back end of line (BEOL) process of a semiconductor integrated circuit. As such, the components of FIG. 1 can be fabricated as part of, or concurrently with, the metal interconnection layers (such as the upper or middle metal interconnection layers) of a semiconductor fabrication process.

For example, fabrication of the components of FIG. 1 can be part of the metal 4 (interconnect) layer of a BEOL process, using mostly a custom process (e.g., separate from the other metal 4 features) to form the components. In FIG. 1, an interlayer dielectric (ILD) 110 is formed. In some embodiments, the ILD 110 is the etch stop covering a metal interconnect layer, such as the metal 3 interconnect layer. The ILD 110 can be etch resistant material, such as silicon nitride (e.g., $Si_3N_4$) or silicon carbide (e.g., SiC).

A gate (or gate electrode) 120 is formed over the ILD 110. The gate 120 is conductive, and can represent one or more layers or features for supplying a gate signal to the backend TFT. For instance, the gate 120 can include a wordline (such as a wordline made of copper (Cu) or aluminum (Al)) to supply a gate signal from a wordline driver, along with diffusion barriers and a metal gate electrode for supplying the gate signal to the channel region of the backend TFT, as will be described in further detail below.

The gate 120 is covered with a gate dielectric 130 corresponding to an active (semiconductor) layer 140 (or to a channel area of the active layer) of the backend TFT. The gate dielectric 130 can be a high-κ dielectric material such as hafnium dioxide ($HfO_2$). The gate dielectric 130 is thin, such as 4 nanometers (nm). In some embodiments, the gate dielectric 130 is in a range of 3 nm to 7 nm. In some embodiments, the gate dielectric 130 is in a range of 2 nm to 10 nm.

The semiconductive active layer 140 is formed over the gate dielectric 130. The active layer 140 can be formed, for example, from one or more of indium gallium zinc oxide (IGZO), indium zinc oxide (IZO), amorphous silicon (a-Si), low-temperature polycrystalline silicon (LTPS), and amorphous germanium (a-Ge). The active layer 140 can be divided into three different regions, namely source and drain regions 142 and 144 with a channel region 146 between and physically connecting the source and drain regions 142 and 144. The active layer 140 forms a transistor device with the gate 120 and gate dielectric 130. When a gate signal is supplied to the gate 120, the active layer 140 becomes conductive, and current flows between the source and drain regions 142 and 144 via the channel region 146.

In some embodiments, the active layer 140 is formed from first type channel material, which may be an n-type channel material or a p-type channel material. An n-type channel material may include indium tin oxide (ITO), indium gallium zinc oxide (IGZO), indium zinc oxide (IZO), aluminum-doped zinc oxide (AZO), amorphous silicon (a-Si), zinc oxide (e.g., ZnO), amorphous germanium (a-Ge), polycrystalline silicon (polysilicon or poly-Si), poly-germanium (poly-Ge), or poly-III-V like indium arsenide (InAs). On the other hand, a p-type channel material may include amorphous silicon, zinc oxide (e.g., ZnO), amorphous germanium (a-Ge), polysilicon, poly germanium, poly-III-V like InAs, copper oxide (e.g., CuO), or tin oxide (e.g., SnO). The channel region 146 have a thickness in a range of about 10 nm to about 100 nm.

Above the active layer 140, a source electrode 150 is formed above and electrically connected to the source region 142, a drain electrode 170 is formed above and electrically connected to the drain region 144, and a capping layer 160 is formed above the channel region 146 and between the source and drain electrodes 150 and 170. The capping layer 160 forms a good interface with the active layer 140 materials, preventing leakage and being hermetic to other metal layers or features. In some embodiments, the capping layer 160 physically connects and electrically separates the source and drain electrodes 150 and 170. For example, in some embodiments, the capping layer 160 includes an insulator material, such as aluminum oxide (e.g., $Al_2O_3$), gallium oxide (e.g., $Ga_2O_3$), silicon nitride (e.g., $Si_3N_4$, SiN), silicon dioxide ($SiO_2$), titanium dioxide ($TiO_2$), hafnium dioxide ($HfO_2$), silicon oxynitride (e.g., $Si_2N_2O$, $SiO_xN_y$ with $0 \le x \le 2$ and $0 \le y \le 4/3$), aluminum silicate (e.g., $Al_2O_3(SiO_2)_x$ with $x>0$), tantalum oxide (e.g., $Ta_2O_5$), hafnium tantalum oxide (e.g., $HfTa_xO_y$ with $x>0$ and $y>2$), aluminum nitride (e.g., AlN), aluminum silicon nitride (e.g., $AlSi_xN_y$ with $x>0$ and $y>1$), sialon (e.g., AlSixOyNz with $x>0$, $y>0$, and $z>0$), zirconium dioxide ($ZrO_2$), hafnium zirconium oxide (e.g., $HfZr_xO_y$ with $x>0$ and $y>2$), tantalum silicate (e.g., $TaSi_xO_y$ with $x>0$ and $y>0$), hafnium silicate (e.g., $HfSiO_4$, $HfSi_xO_y$ with $x>0$ and $y>2$), or the like.

The source and drain electrodes 150 and 170 can be metal, such as metal interconnect layer material (e.g., Cu, Al, or tungsten (W)). The backend TFT acts as a switch, electrically connecting the source and drain electrodes 150 and 170 in response to a gate signal being supplied to the gate 120.

A storage node 180 (e.g., further metal interconnect material) is formed above and electrically connected to the drain electrode 170. A ferroelectric capacitor 190 is formed above and electrically connected to the storage node 180. In FIG. 1, the ferroelectric capacitor 190 is a metal insulator-metal (MIM) capacitor having a stacked structure. For example, the ferroelectric capacitor 190 in FIG. 1 is formed in layers, including first and second terminals 192 and 194 made of metal or other conductive material and a ferroelectric dielectric layer 196 between and electrically insulating the first and second terminals 192 and 194. The first terminal 192 is electrically connected to the drain region 144 through the drain electrode 170 and the storage node 180. The ferroelectric dielectric layer 196 includes one or more of lead zirconate titanate (PZT), hafnium zirconium oxide (HZO), barium titanate ($BaTiO_3$), lead titanate ($PbTiO_3$), and doped hafnium dioxide ($HfO_2$). The doped $HfO_2$ can include one or more of silicon-doped $HfO_2$, yttrium-doped $HfO_2$, and aluminum-doped $HfO_2$.

The ferroelectric material in the dielectric layer 196 has a hysteresis effect; each of the different lattices in the ferroelectric material aligning either parallel or anti-parallel. By using coercive fields to align all or most of the lattices either parallel or anti-parallel, the ferroelectric material can take on a memory value (logical 0 or 1) corresponding to one of the two orientations. The ferroelectric material continues to maintain this value (orientation) even when power is no longer supplied to the integrated circuit. For example, the lattice orientation in the ferroelectric material does not change under normal conditions, which is unlike normal DRAM capacitors that leak their stored changes over time and need frequent refreshing to maintain their memory states.

Figure 2:
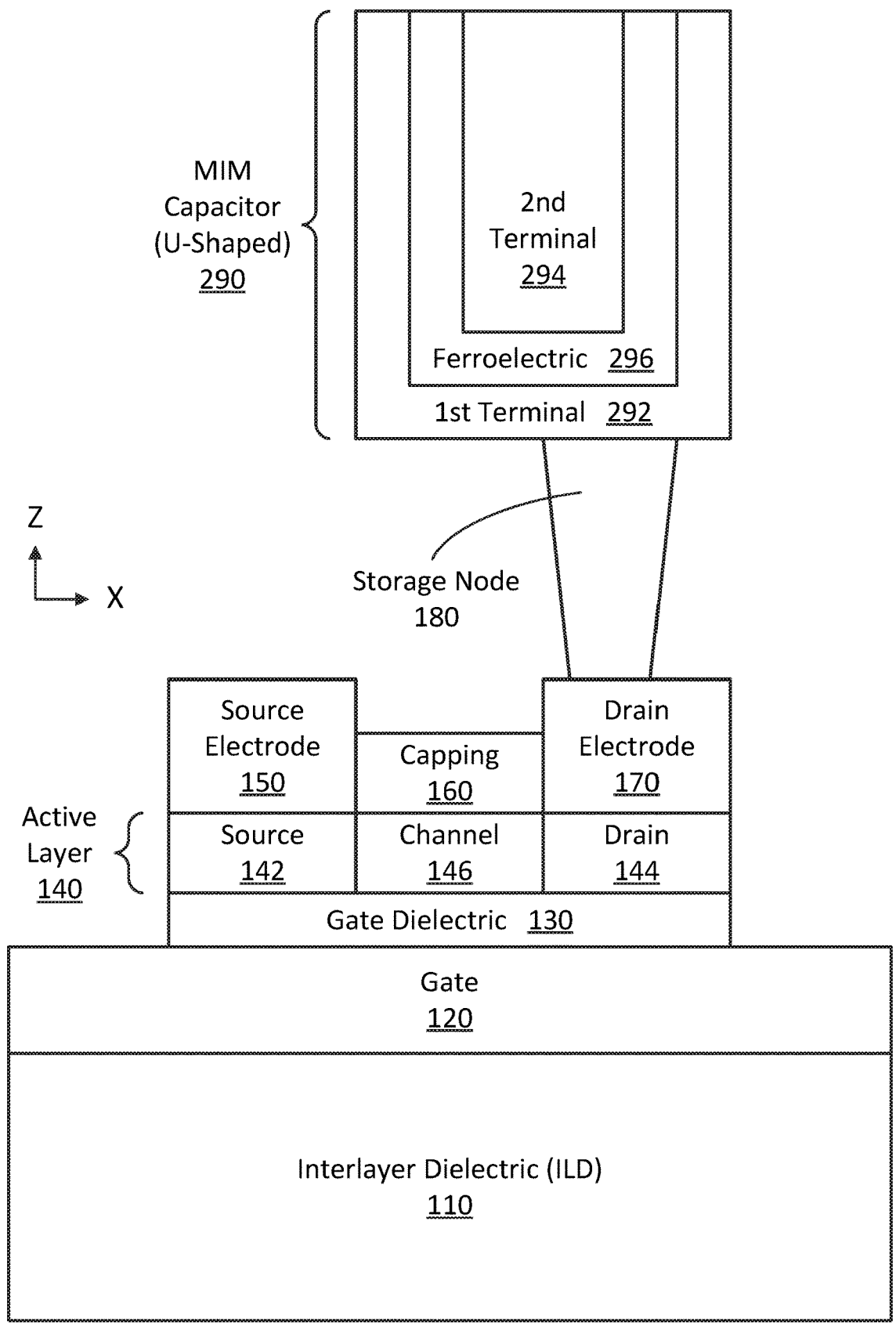
FIG. 2 is a cross-sectional view of an example integrated circuit including a U-shaped ferroelectric capacitor with a backend TFT, according to an embodiment of the present disclosure.

FIG. 2 is a cross-sectional (X-Z) view of an example integrated circuit including a U-shaped ferroelectric capacitor 290 with backend TFT, according to an embodiment of the present disclosure. Here, the integrated circuit has a similar structure to that of FIG. 1, but the ferroelectric capacitor 290 has a U-shaped structure, with first and second terminals 292 and 294, and a U-shaped ferroelectric dielectric 296. The U-shape can take advantage of the thicker metal interconnection layers to etch a relatively deep trench to boost capacitive surface area and capacitance without increasing planar area. An example U-shaped capacitor is described in further detail below.

Figure 3:
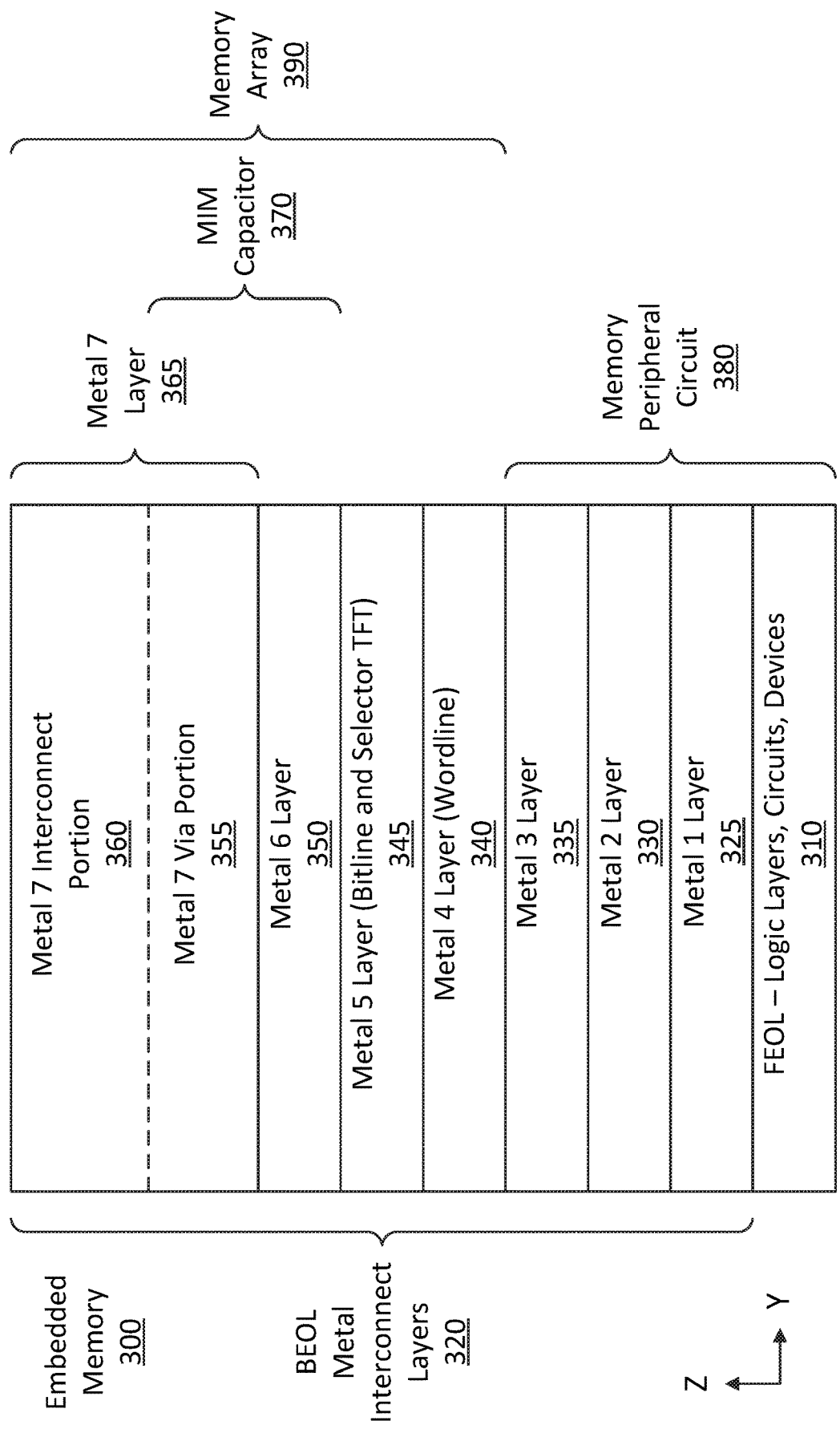
FIG. 3 is a cross-sectional view of an example embedded memory, according to an embodiment of the present disclosure.

FIG. 3 is a cross-sectional (Y-Z) view of an example embedded memory 300, according to an embodiment of the present disclosure. FIG. 3 illustrates the Y and Z dimensions (width and height, respectively), the X dimension (length) extending into and out of the Y-Z plane. The embedded memory 300 includes an FEOL 310 that includes most of the various logic layers, circuits, and devices to drive and control the integrated circuit (e.g., chip) being fabricated with the embedded memory 300. As illustrated in FIG. 3, the embedded memory 300 also includes a BEOL 320 including, in this case, seven metal interconnection layers (namely, metal 1 layer 325, metal 2 layer 330, metal 3 layer 335, metal 4 layer 340, metal 5 layer 345, metal 6 layer 350, and metal 7 layer 365, including metal 7 via portion 355 and metal 7 interconnect portion 360) to interconnect the various inputs and outputs of the FEOL 310.

Generally speaking, and specifically illustrated for the metal 7 layer 365, each of the metal 1 layer 325 through the metal 7 layer 365 includes a via portion and an interconnect portion located above the via portion, the interconnect portion being for transferring signals along metal lines extending in the X or Y directions, the via portion being for transferring signals through metal vias extending in the Z direction (such as to the next lower metal layer underneath). Accordingly, vias connect metal structures (e.g., metal lines or vias) from one metal layer to metal structures of the next lower metal layer. Further, each of the metal 1 layer 325 through the metal 7 layer 365 includes a pattern of conductive metal, such as copper (Cu) or aluminum (Al), formed in a dielectric medium or interlayer dielectric (ILD), such as by photolithography.

In addition, the embedded memory 300 is further divided into a memory array 390 (e.g., an eNVM memory array) built in the metal 4 layer 340 through the metal 7 layer 365 and including the low-leakage selector TFTs (in the metal 5 layer 345) and MIM capacitors 370 (in the metal 6 layer 350 and metal 7 layer via portion 355) as well as the wordlines (e.g., row selectors, in the metal 4 layer 340) and the bitlines (e.g., column selectors, in the metal 5 layer 345) making up the eNVM memory cells, and a memory peripheral circuit 380 built in the FEOL and metal 1 layer 325 through metal 3 layer 335 to control (e.g., access, store, refresh) the memory array 390.

Compared to other techniques that locate such a memory control circuit in the same layers as the memory array but in a different macro (or X-Y) area of the integrated circuit than the memory array (such as at a periphery of the memory array), the embedded memory 300 locates the memory peripheral circuit 380 below the memory array 390 (e.g., in the same X-Y area). This saves valuable X-Y area in the finished integrated circuit. In further detail, the embedded memory 300 embeds the low-leakage selector TFTs (e.g., backend TFTs) in the metal 5 layer 345 (such as the via portion of the metal 5 layer 345). For example, the metal 4 layer 340 can contain the wordlines extending in the X direction to select a row of memory cells (bits) while the metal 5 layer 345 can contain the bitlines extending in the Y direction to sense each of the memory cells (bits) in the selected row (and to write memory data to any of the memory cells in the selected row). The selector TFTs can be fabricated in the metal 5 layer 345, above the wordlines (that serve as or connect to the gate electrodes or contacts) and below the bitlines (that serve as the source electrodes or contacts). For example, the selector TFT can have the transistor gate below the thin-film layer (that can be formed at the bottom of the metal 5 layer 345, such as in the via portion) and source and drain contacts above the thin-film layer.

In further detail, in some embodiments, the metal gate of the selector TFT in each memory cell can be connected to a continuous metal 4 line below, such as a copper (Cu)-based metal line, which provides much lower resistance compared to gate lines formed in the lower (e.g., FEOL) portions of the integrated circuit. The continuous metal 4 line is used as the wordline of the memory array, and is covered by diffusion barriers or diffusion barrier layers including dielectric layers, such as silicon nitride (e.g., $Si_3N_4$), silicon carbide (e.g., SiC), or the like, with vias filled with metal-diffusion barrier films like tantalum nitride (TaN), tantalum (Ta), titanium zirconium nitride (e.g., $Ti_xZr_{1-x}N$, such as X=0.53), titanium nitride (e.g., TiN), titanium tungsten (TiW), or the like. A metal gate layer covers the diffusion barrier film-filled vias, which electrically connect the copper (Cu) wordline to the metal gates of the selector TFTs, the diffusion barrier film preventing or helping to prevent the diffusion or migration of copper (Cu) from the wordline to the rest of the selector TFTs. An active thin-film layer (e.g., indium gallium zinc oxide, or IGZO) and then source and drain contacts above the thin-film layer use the metal 5 layer 345. The space between the source and drain contacts determines the gate length of the selector transistor. A three-dimensional MIM capacitor 370 (e.g., a ferroelectric capacitor) is embedded in the metal 6 layer 350 and via portion 355 of the metal 7 layer 365 (below the metal 7 interconnect portion 360).

Figure 4A:
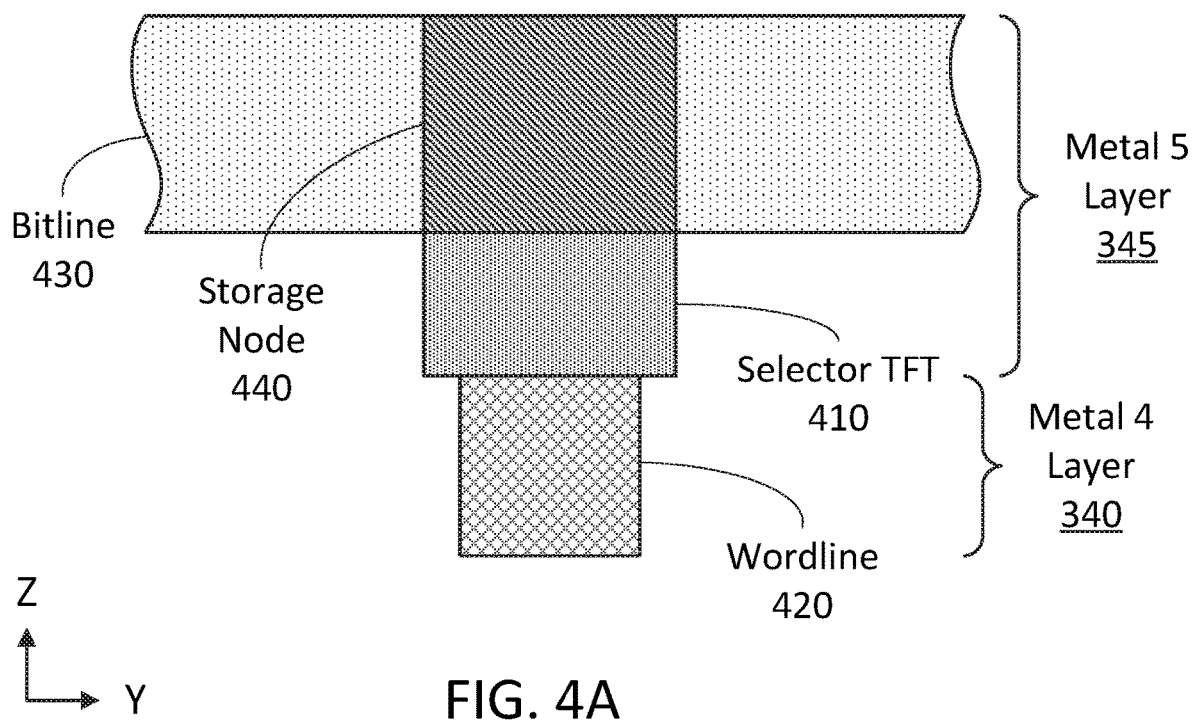
FIGS. 4A-4B are cross-sectional and plan views, respectively, of an example selector TFT of a memory cell, according to an embodiment of the present disclosure.
Figure 4B:
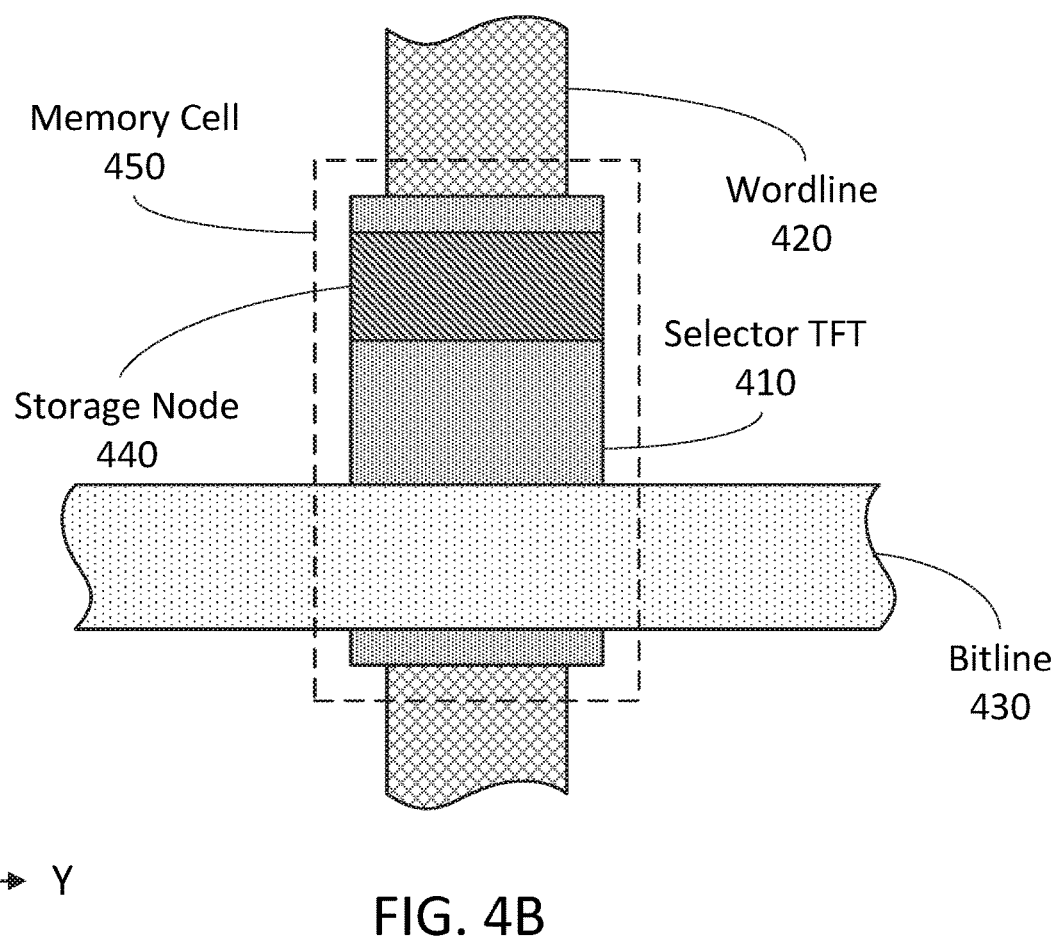
Figure 5A:
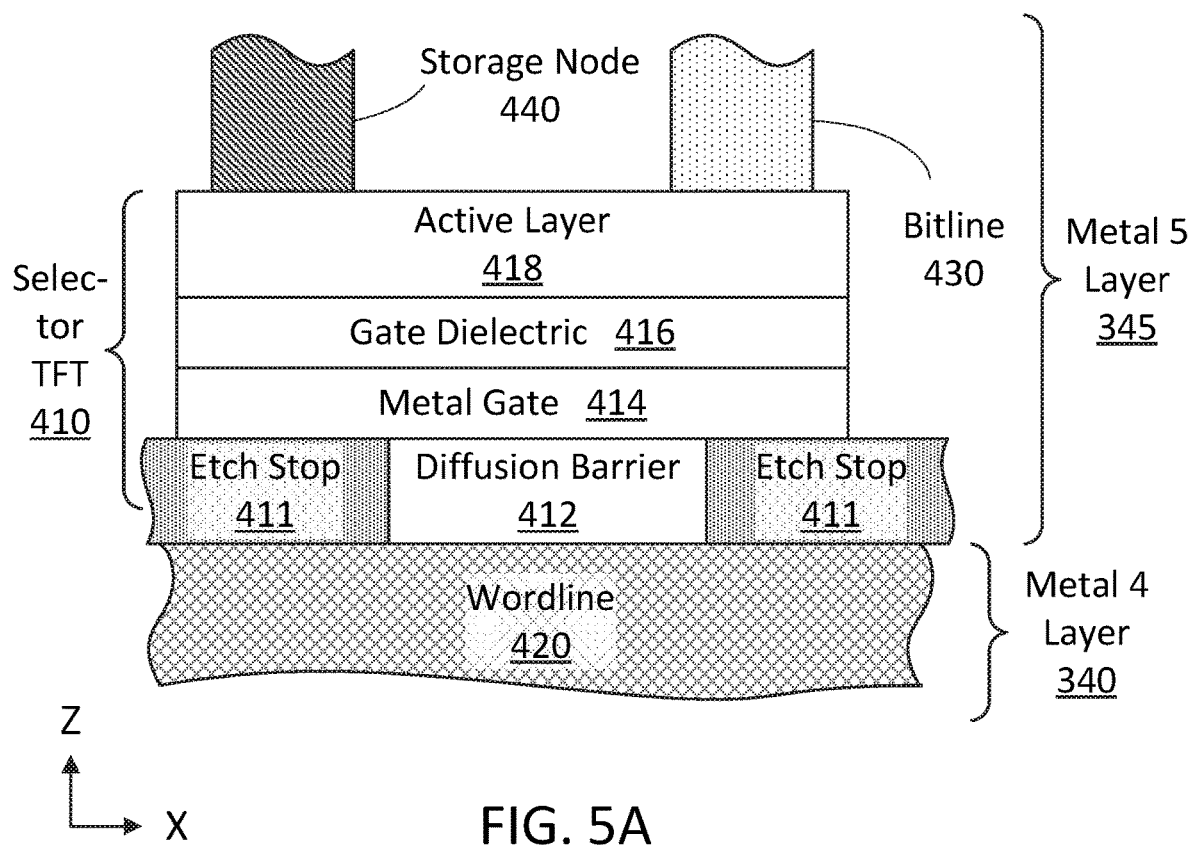
FIGS. 5A-5B are cross-sectional views of an example structure of the selector TFT in the memory cell of FIGS. 4A-4B, according to an embodiment of the present disclosure.
Figure 5B:
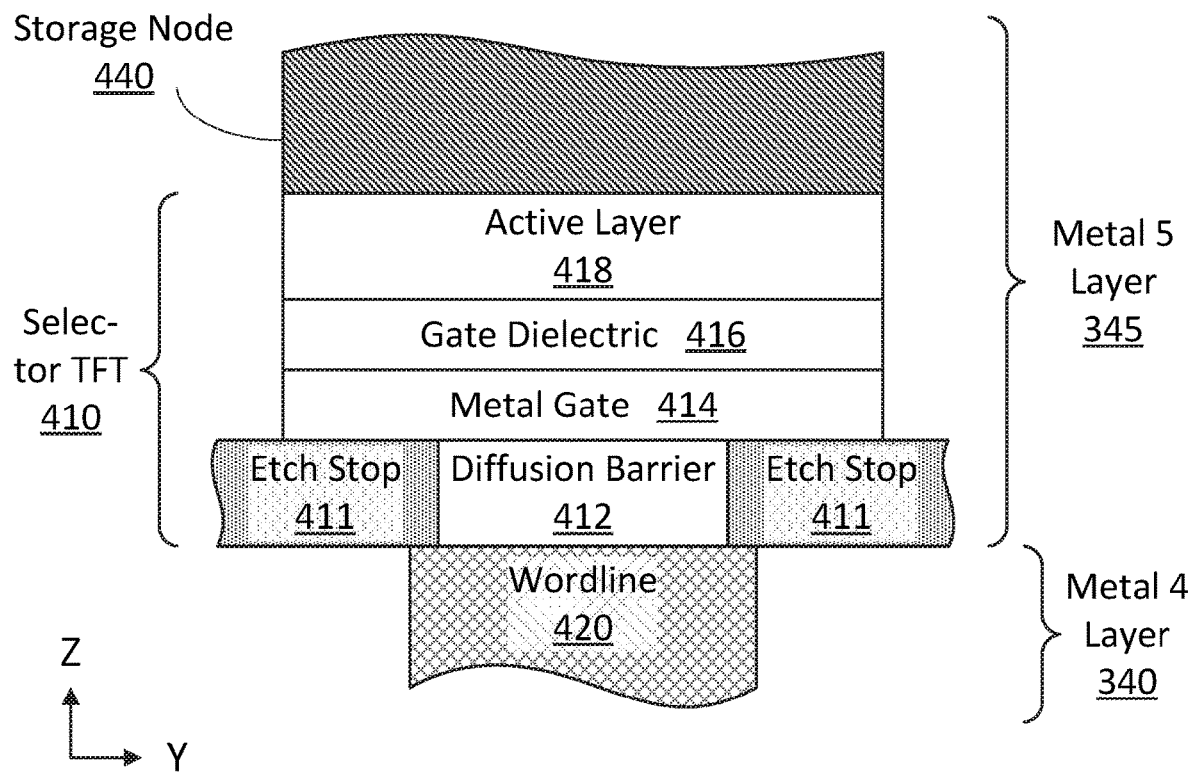

FIGS. 4A-4B are cross-sectional (Y-Z) and plan (Y-X) views, respectively, of an example selector TFT 410 (e.g., backend TFT) in an embedded memory cell 450 (such as a nonvolatile memory cell using a ferroelectric capacitor), according to an embodiment of the present disclosure. FIGS. 5A-5B are cross-sectional (X-Z and Y-Z, respectively) views of an example structure of the selector TFT 410 in the memory cell 450 of FIGS. 4A-4B, according to an embodiment of the present disclosure.

The selector TFT 410 in the memory cell 450 is coupled to or controlled by wordline 420 (which serves as the gate), bitline 430 (which serves as the source contact), and storage node 440 (which serves as the drain contact). In the example embodiment of FIGS. 4A-4B, the wordline 420 is formed in the metal 4 layer 340 (such as with the same process used to fabricate the metal 4 layer 340 for the rest of the integrated circuit), the selector TFT 410 is formed in the metal 5 layer 345 (for instance, in the via portion of the metal 5 layer 345), and the storage node 440 and bitline 430 are formed in the metal 5 layer 345 (for instance, in the interconnect portion of the metal 5 layer 345), the metal 5 layer 345 and above fabrication being customized for the embedded memory (versus the fabrication of the metal 5 layer 345 and above done outside of the memory) to account for the specialized structures in the memory.

For instance, the metal 5 layer 345 for the eNVM may use a different metal, such as titanium nitride (e.g., TiN) or tungsten (W), than the rest of the metal 5 layer 345 outside of the memory. In some embodiments, the same metal (e.g., copper) is used for the metal 5 layer 345 for both inside the and outside the eNVM. Regardless of the choice of metal for the storage node 440 and bitline 430, the height (and width) of these structures can be further modified from those of the rest of the metal 5 layer 345, for example, to reduce capacitance of the bitline 430 with the storage nodes 440. These bitlines 430 can be connected to the sense amplifiers and other bitline drivers below the memory array (e.g., below the metal 4 layer 340) by first coupling the bitlines 430 through the metal 6 layer 350 (e.g., copper interconnect) in an area outside the process, where the bitline signals can be routed through via portions of the metal 5 layer 345, metal 4 layer 340, metal 3 layer 335, and further below if needed.

In the example embodiment of FIGS. 5A-5B, the bottom gate selector TFT 410 may include thin-film layers such as one or more gate electrode layers (e.g., diffusion barrier 412 and metal gate 414), a gate dielectric layer (e.g., gate dielectric 416), and a semiconductor (active) layer (e.g., active layer 418). The diffusion barrier 412 can be a metal- or copper-diffusion barrier (e.g., a conductive material to reduce or prevent the diffusion of metal or copper from wordline 420 into the metal gate 414 while still maintaining an electrical connection between the wordline 420 and the metal gate 414) on the wordline 420 such as tantalum nitride (TaN), tantalum (Ta), titanium zirconium nitride (e.g., $Ti_xZr_{1-x}N$, such as X=0.53), titanium nitride (e.g., TiN), titanium tungsten (TiW), combination (such as a stack structure of TaN on Ta), or the like.

For instance, the diffusion barrier 412 can include a single- or multi-layer structure including a compound of tantalum (Ta) and nitrogen (n), such as TaN or a layer of TaN on a layer of Ta. In some embodiments, a layer of etch resistant material (e.g., etch stop 411) such as silicon nitride (e.g., $Si_3N_4$) or silicon carbide (e.g., SiC) is formed over the wordline 420 with vias for a metal (or copper) diffusion barrier film 412 such as TaN or a TaN/Ta stack. The metal gate 414 can be a conductive material on the diffusion barrier 412, such as metal, conductive metal oxide or nitride, or the like. For example, in one embodiment, the metal gate 414 is titanium nitride (TiN). In another embodiment, the metal gate 414 is tungsten (W).

The gate dielectric 416 can be silicon dioxide ($SiO_2$), silicon nitride (e.g., $Si_3N_4$), hafnium dioxide ($HfO_2$) or other high-κ material, or a multi-layer stack including a first layer of $SiO_2$ and a second layer of a high-κ dielectric such as $HfO_2$ on the $SiO_2$. Any number of gate dielectrics can be used, as will be appreciated in light of the present disclosure. For example, in one embodiment, the gate dielectric 416 is a layer of $SiO_2$. In another embodiment, the gate dielectric 416 is a stack (e.g., two or more layers) of $HfO_2$ on $SiO_2$.

The active layer 418 can be IGZO or the like in contact with the bitline 430 (e.g., at a first region of the active layer 418, such as a source region) and the storage node 440 (e.g., at a second region of the active layer 418, such as a drain region, with a semi-conductive channel region between the first region and the second region). Such an active layer 418 channel may include only majority carriers in the thin film. Accordingly, the active layer 418 channel may require high bias (as supplied by the wordline 420, diffusion barrier film 412, and metal gate 414) to activate. In addition to IGZO, in some embodiments, the active layer is one of a variety of polycrystalline semiconductors, including, for example, zinc oxynitride (ZnON, such as a composite of zinc oxide (ZnO) and zinc nitride ($Zn_3N_2$), or of ZnO, $ZnO_xN_y$, and $Zn_3N_2$), indium tin oxide (ITO), tin oxide (e.g., SnO), copper oxide (e.g., $Cu_2O$), polycrystalline germanium (poly-Ge) silicon-germanium (e.g., SiGe, such as $Si_{1-x}Ge_x$) structures (such as a stack of poly-Ge over SiGe), and the like.

Figure 6A:
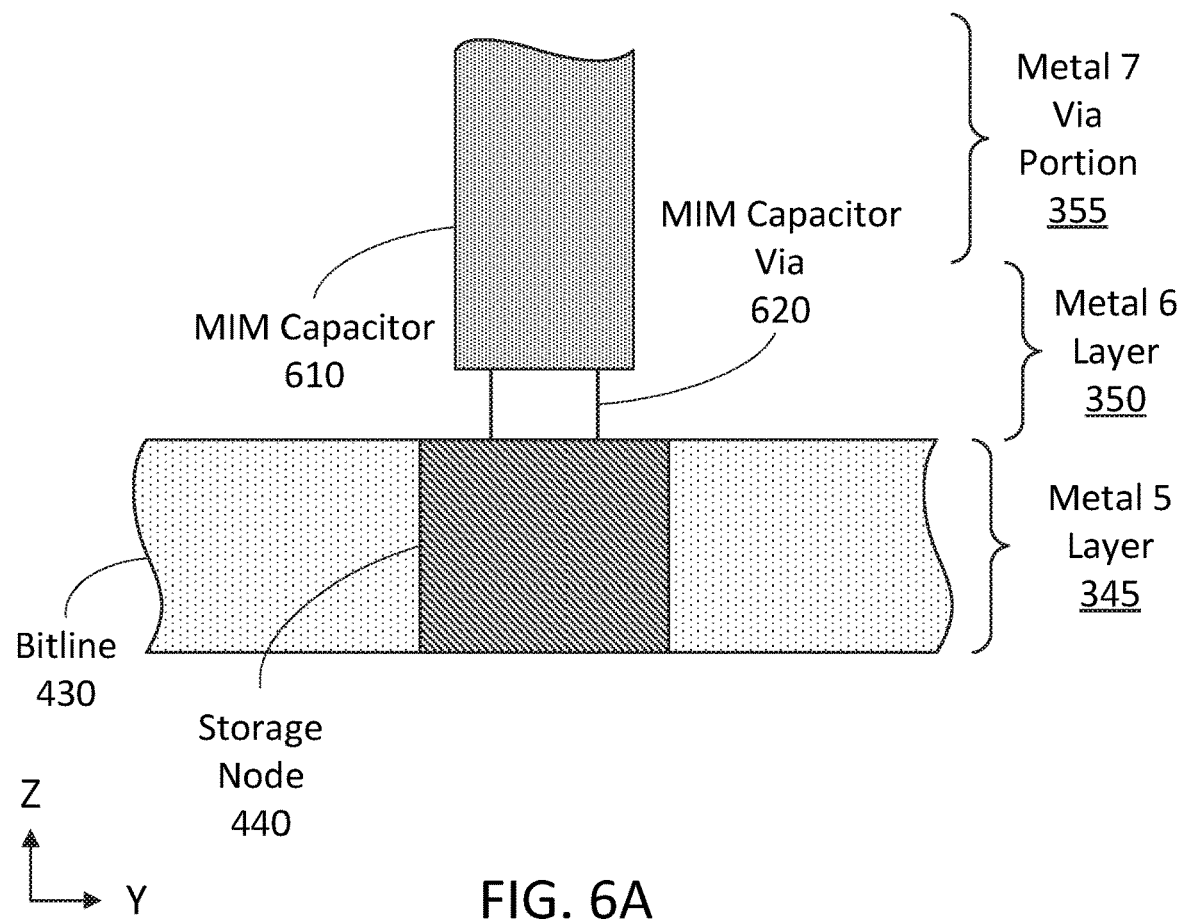
FIGS. 6A-6B are cross-sectional and plan views, respectively, of an example metal-insulator-metal (MIM) capacitor in the memory cell of FIGS. 4A-4B, according to an embodiment of the present disclosure.
Figure 6B:
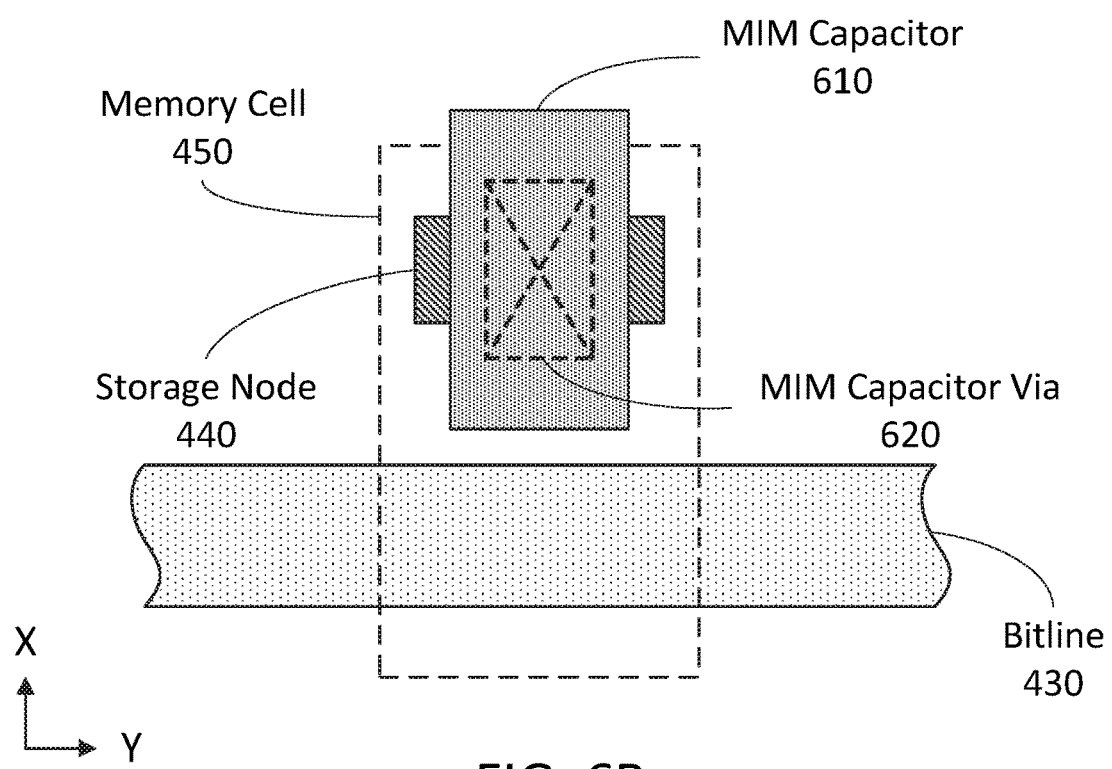
Figure 7:
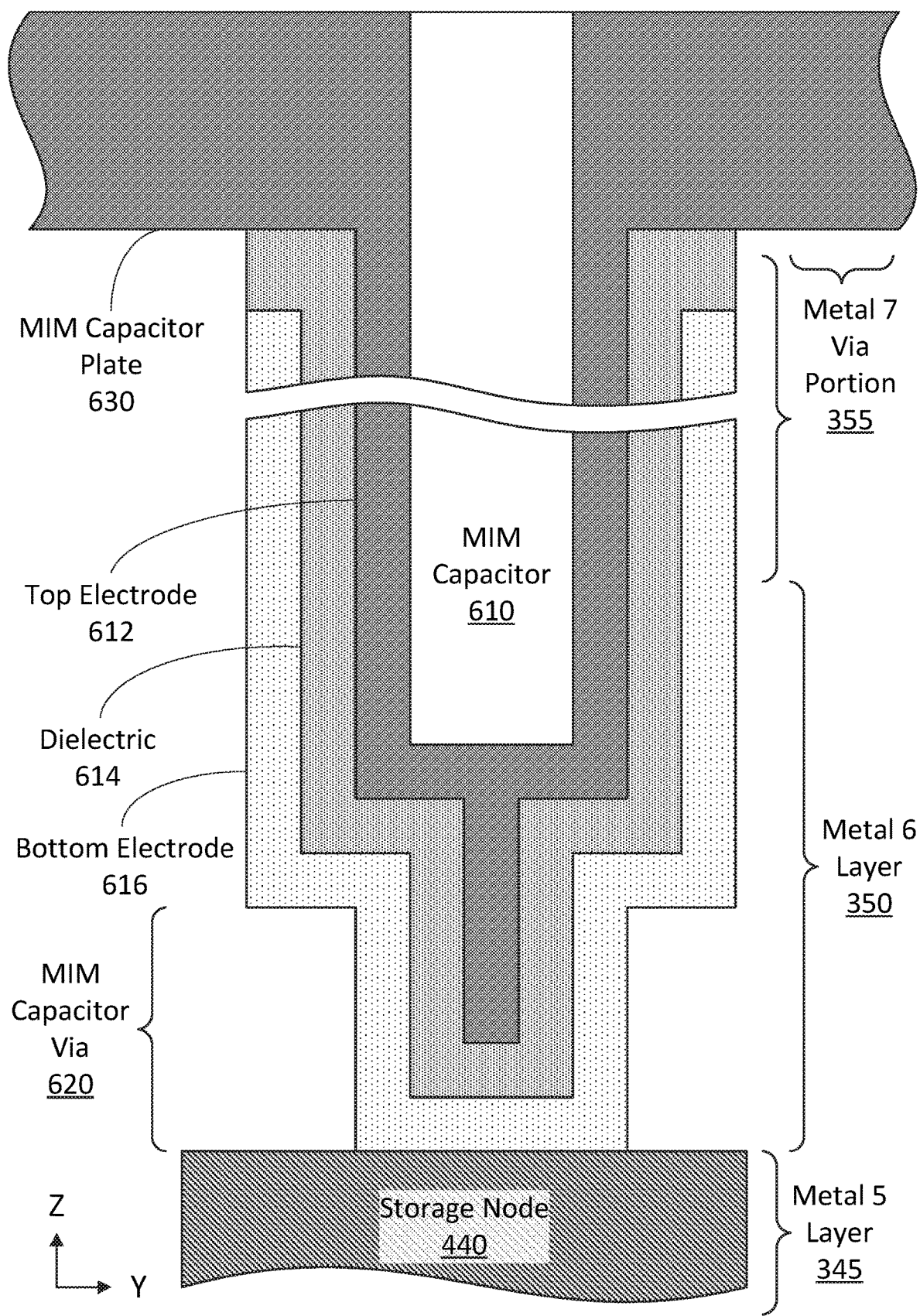
FIG. 7 is a cross-sectional view of an example structure of the MIM capacitor in the memory cell of FIGS. 6A-6B, according to an embodiment of the present disclosure.

FIGS. 6A-6B are cross-sectional (Y-Z) and plan Y-X views, respectively, of an example metal-insulator-metal (MIM) capacitor 610 (e.g., a ferroelectric capacitor having a U-shaped structure) in the memory cell 450 of FIGS. 4A-4B, according to an embodiment of the present disclosure. FIG. 7 is a cross-sectional (Y-Z) view of an example structure of the MIM capacitor 610 in the memory cell 450 of FIGS. 6A-6B, according to an embodiment of the present disclosure.

The storage nodes 440 (drain contacts) of the selector TFTs 410 in the memory cells 450 are separated between cells 450. Each storage node 440 is connected to a MIM capacitor 610 through the MIM capacitor via 620. For example, the MIM capacitor via 620 may be fabricated in the via portion of the metal 6 layer 350 while the MIM capacitor 610 may be fabricated in the interconnect portion of the metal 6 layer 350 and the via portion 355 of the metal 7 layer 365. The MIM capacitor 610 may be fabricated by etching (for example, by photolithography) deep, narrow trenches in the upper portion of the metal 6 layer 350 and the via portion 355 of the metal 7 layer 365, and lining the trenches with a thin conductor (such as bottom electrode 616), a thin insulator (such as ferroelectric dielectric 614), and another thin conductor (such as top electrode 612), the thin insulator insulating one thin conductor from the other thin conductor. The MIM capacitor 610 is fabricated in a separate process from the rest of the metal 6 layer and metal 7 layer fabrication (to account for its large height and different electrode material from the rest of the metal 6 layer and metal 7 layer. This creates a relatively large capacitance in the MIM capacitor 610 by having a relatively large surface area for the terminals (e.g., top and bottom electrodes 612 and 616) separated by a relatively small amount of insulation (e.g., dielectric 614).

In further detail, in one or more embodiments of the present disclosure, the MIM capacitor 610 is formed by etching a trench in the metal 6 layer (e.g., interconnect portion) and metal 7 layer (e.g., via portion), and successively filling the trench with the three layers by, for example, atomic level deposition (ALD). For instance, the bottom electrode 616 can be filled to a thickness of 20-40 nm using a conductive material (e.g., metal, conductive metal nitride or carbide, or the like), followed by a thin ferroelectric dielectric 614 (to increase capacitance, for example, 20-40 nm), followed by a top electrode 612 again, using metal (such as 20-40 nm thick), which can be coupled to the top electrode of every other MIM capacitor 610 (e.g., in an array of eNVM memory cells). The MIM capacitor 610 can be at least 300 nm in some embodiments (e.g., for metal 5 layers on the order of 140 nm), to provide sufficient capacitance.

For example, in one embodiment, the bottom electrode 616 is tantalum (Ta). In another embodiment, the bottom electrode 616 is titanium nitride (TiN). In some embodiments, the bottom electrode 616 is titanium aluminum nitride (e.g., TiAlN, where the molar amount of titanium is at least that of aluminum). In another embodiment, the bottom electrode 616 is tantalum aluminum carbide (TaAlC). In another embodiment, the bottom electrode 616 is tantalum nitride (TaN). For example, in one embodiment, the top electrode 612 is TiN. For example, in one embodiment, the dielectric 614 is a ferroelectric material, such as lead zirconate titanate (PZT), hafnium zirconium oxide (HZO), barium titanate ($BaTiO_3$), lead titanate ($PbTiO_3$), and doped hafnium dioxide ($HfO_2$). The doped $HfO_2$ can include one or more of silicon-doped $HfO_2$, yttrium-doped $HfO_2$, and aluminum-doped $HfO_2$.

Each bottom electrode 616 of the MIM capacitor 610 connects to a corresponding storage node 440 through the MIM capacitor via 620. The bottom electrodes 616 of the MIM capacitors 610 are electrically insulated from each other while the top electrodes 612 of the MIM capacitors 610 are electrically connected to each other through a (shared) MIM capacitor plate 630 at the top of the MIM capacitors 610 and also located in the via portion 355 of the metal 7 layer 365. For example, there may be separate MIM capacitor plates 630 for separate arrays of MIM capacitors 610 or for separate groups of MIM capacitors 610 corresponding to the same bitline. The MIM capacitor plate 630 may be coupled to a common voltage line (for example in the interconnect portion 360 of the metal 7 layer 365) to supply a common voltage (e.g., a ground voltage) to all the top electrodes 612 through the MIM capacitor plate 630.

The source contact of the selector TFT 410 is continuous and is used as the bitline 430 of the memory array 390. The heights of the source and drain contacts can be optimized to reduce bitline 430 capacitance (e.g., between the source and drain contacts) for better sensing margins. The source contacts of the selector TFTs also serves as the bitlines 430 of the array. The dimensions of the source contacts (bitlines 430) can be customized for lower inter-metal capacitance (e.g., by using a separate fabrication stage to form the bitlines 430 versus the fabrication stage for this metal level in areas of the integrated circuit outside of the memory array). Each MIM capacitor 410 connects to a drain contact (e.g., storage node 440) of the selector TFT 410 through the MIM capacitor via 620.

Figure 8:
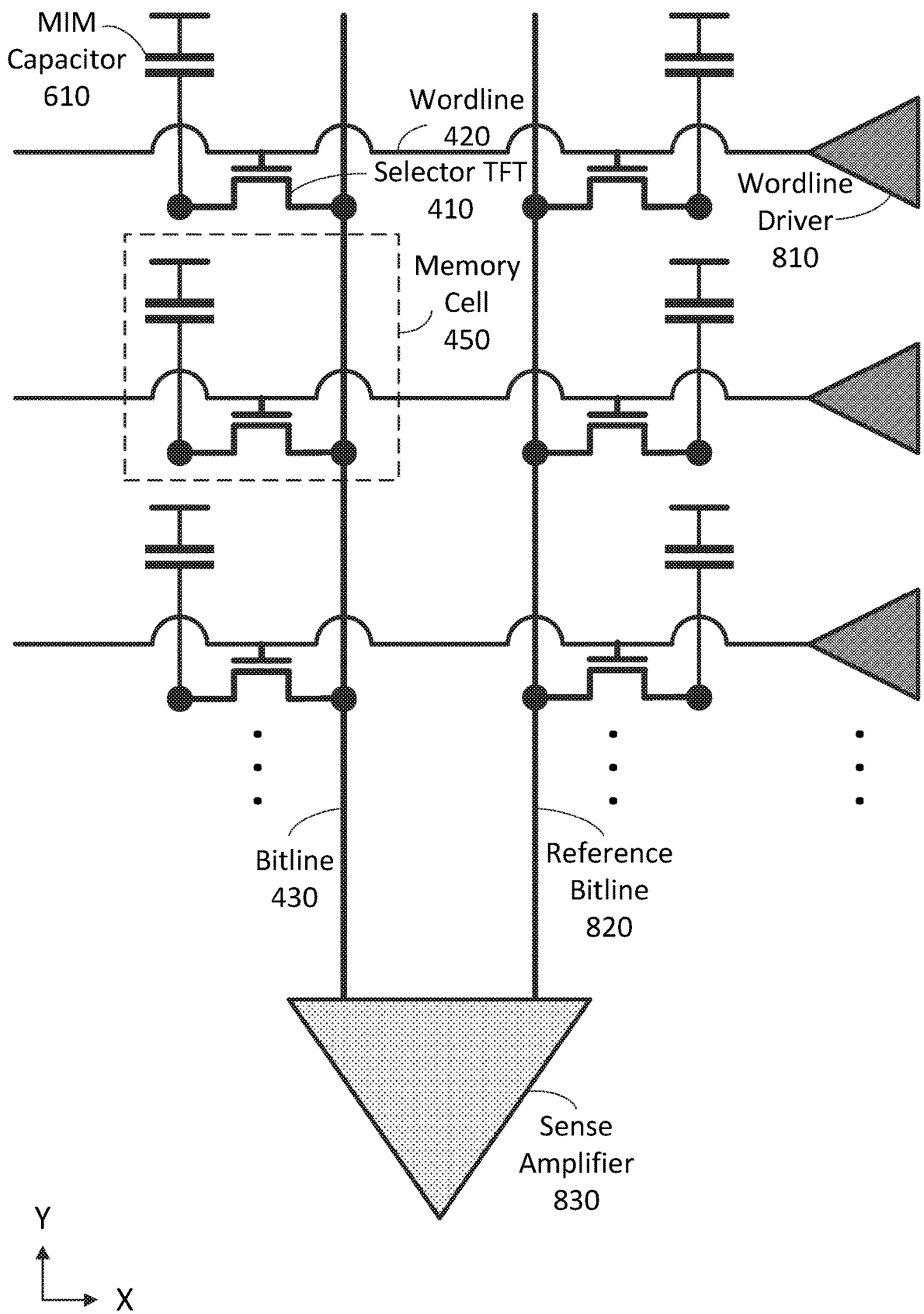
FIG. 8 is a schematic plan view of an example embedded memory configuration, according to an embodiment of the present disclosure.

FIG. 8 is a schematic plan (X-Y) view of an example embedded memory configuration, according to an embodiment of the present disclosure. The memory array configuration of FIG. 8 includes memory cells 450 at crossing regions of wordlines 420 and bitlines 430 (e.g., each memory cell 450 being driven by a unique pair of wordline 420 and bitline 430), each memory cell 450 including a selector TFT 410 and a MIM capacitor 610. Each wordline 420 is selected by a corresponding wordline driver 810, while the corresponding bitlines 430 are used to sense the state of the ferroelectric material (e.g., parallel or anti-parallel) in the MIM capacitor 610 of each of the corresponding bits of the selected wordline 420. In some embodiments, a reference column of memory cells provides a corresponding reference signal (e.g., halfway between a logic low value and a logic high value) over a reference bitline 820 concurrently with the sensing of the desired bit on the bitline 430. These two values are compared, by a sense amplifier 830, which determines whether the desired bit is a logic high value (e.g., 1) or a logic low value (e.g., 0).

The memory cells 450 are embedded in BEOL layers (such as the higher metal interconnect layers of the BEOL) while the peripheral circuits responsible for memory operation, including the read sense amplifiers 830 (and other bitline driver circuits) and wordline driver circuits 810, are placed below the memory array (e.g., in the FEOL and lower metal interconnect layers of the BEOL) to reduce area of the embedded memory.

FIG. 9A is a plan (Y-X) view of an example layout of an embedded memory without overlap of the memory array 390 and memory peripheral circuit (illustrated as wordline drivers 810 and column circuits 910). FIGS. 9B-9C are plan (Y-X) views of an example layout or floorplan of an embedded memory with overlap of the memory array 390 and memory peripheral circuits 810 and 910, according to an embodiment of the present disclosure.

The column circuits 910 (or bitline drivers) include devices such as read (bitline) sense amplifiers 830 and precharging circuits. FIG. 9A shows the circuits spread out (e.g., occupying FEOL macro area or CMOS logic transistor area) and without overlap. By contrast, FIG. 9B shows the memory array 390 occupying the higher metal interconnection layers of the BEOL 320 (as illustrated in FIGS. 1-7) and FIG. 9C shows the memory peripheral circuits 810 and 910 occupying the FEOL 310 and lower metal interconnection layers of the BEOL 320 underneath the memory array 390 (as illustrated in FIG. 3). Since more than 35% of the embedded memory macro area can be consumed by the peripheral (memory control) circuits, substantial savings of X-Y macro area can be saved by fabricating the memory arrays above the memory peripheral circuits, as in one or more embodiments of the present disclosure. Put another way, according to some embodiments of the present disclosure, an embedded memory is provided with memory cells only using space in the upper metal layers (e.g., metal 4 layer and above), the peripheral circuits being moved below the memory cells (e.g., in metal 3 layer and below, including the FEOL) and substantially reduce the memory area.

Figure 10:
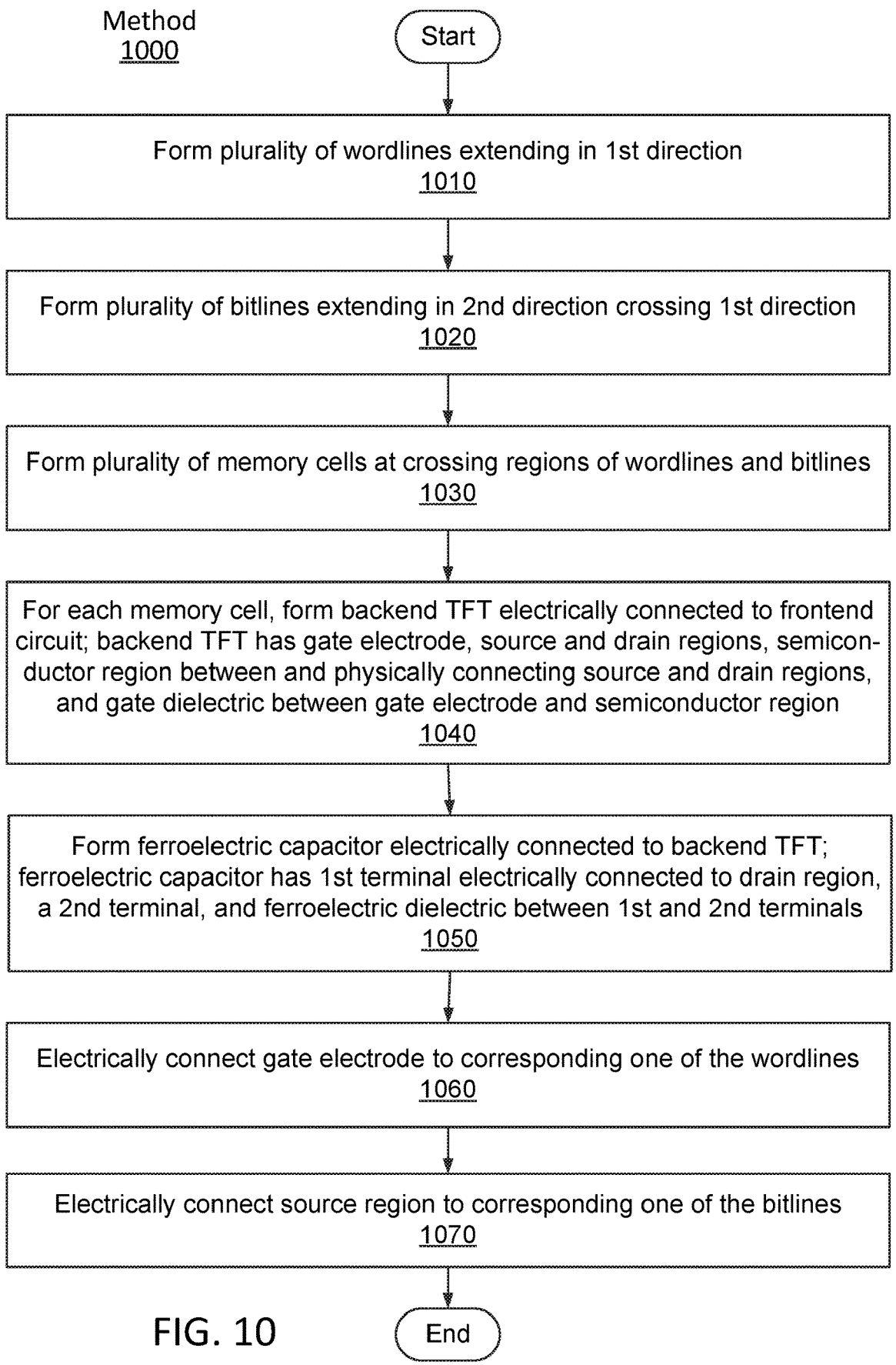
FIG. 10 illustrates an example method of fabricating an embedded memory, according to an embodiment of the present disclosure.

FIG. 10 illustrates an example method 1000 of fabricating an embedded memory (e.g., an eNVM), according to an embodiment of the present disclosure. This and other methods disclosed herein may be carried out using integrated circuit fabrication techniques such as photolithography as would be apparent in light of the present disclosure. The corresponding nonvolatile memory cell and embedded memory including the memory cells may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal), either directly or indirectly (such as through one or more conductive layers in between).

Referring to FIG. 10 (with specific example references to the structures of FIGS. 1-9) method 1000 includes forming 1010 a plurality of wordlines (such as wordlines 420) extending in a first direction (such as an X-direction), forming 1020 a plurality of bitlines (such as bitlines 430) extending in a second direction (such as a Y-direction) crossing the first direction, and forming 1030 a plurality of memory cells (such as memory cells 450) at crossing regions (see FIG. 8) of the wordlines and the bitlines. For some or all the memory cells, method 1000 further includes forming 1040 a backend thin-film transistor (TFT, such as selector TFT 410) on or otherwise in electrical connection with a frontend circuit (such as wordline drivers 810 and sense amplifiers 830) and forming 1050 a ferroelectric capacitor (such as MIM capacitor 610) on or otherwise in electrical connection with the backend TFT. The backend TFT has a gate electrode (such as gate 120), source and drain regions (such as source and drain regions 142 and 144, a semiconductor region (such as channel region 146) between and physically connecting the source and drain regions, and a gate dielectric (such as gate dielectric 130) between the gate electrode and the semiconductor region. The ferroelectric capacitor has a first terminal (such as first terminal 192) electrically connected to the drain region, a second terminal (such as second terminal 194), and a ferroelectric dielectric (such as ferroelectric dielectric 196) between the first and second terminals. For some or all the memory cells, method 1000 further includes electrically connecting 1060 the gate electrode to a corresponding one of the wordlines, and electrically connecting 1070 the source region to a corresponding one of the bitlines.

While the above example methods appear as a series of operations or stages, it is to be understood that there is no required order to the operations or stages unless specifically indicated. For example, in various embodiments of method 1000, for each memory cell, the electrically connecting 1060 of the gate electrode to a corresponding one of the wordlines can take place before, during, or after the electrically connecting 1070 of the source region to a corresponding one of the bitlines.

Example System

Figure 11:
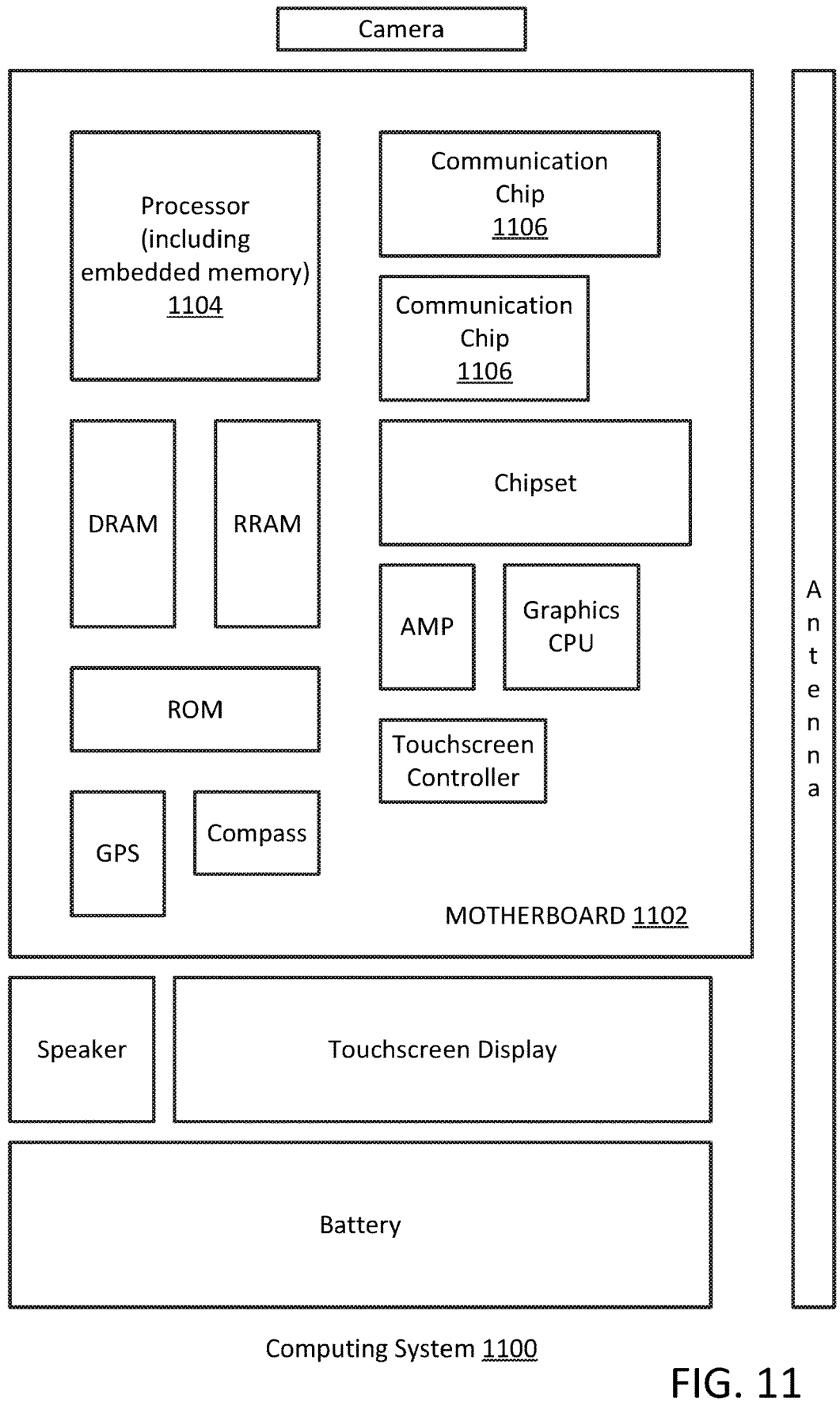
FIG. 11 illustrates an example computing system implemented with the integrated circuit structures or techniques disclosed herein, according to an embodiment of the present disclosure These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

FIG. 11 illustrates a computing system 1100 implemented with the integrated circuit structures or techniques disclosed herein, according to an embodiment of the present disclosure. As can be seen, the computing system 1100 houses a motherboard 1102. The motherboard 1102 may include a number of components, including, but not limited to, a processor 1104 (including embedded memory) and at least one communication chip 1106, each of which can be physically and electrically coupled to the motherboard 1102, or otherwise integrated therein. As will be appreciated, the motherboard 1102 may be, for example, any printed circuit board, whether a main board, a daughterboard mounted on a main board, or the only board of system 1100, to name a few examples.

Depending on its applications, computing system 1100 may include one or more other components that may or may not be physically and electrically coupled to the motherboard 1102. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1100 may include one or more integrated circuit structures or devices (e.g., one or more memory cells) formed using the disclosed techniques in accordance with an example embodiment. In some embodiments, multiple functions can be integrated into one or more chips (e.g., for instance, note that the communication chip 1106 can be part of or otherwise integrated into the processor 1104).

The communication chip 1106 enables wireless communications for the transfer of data to and from the computing system 1100. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing system 1100 includes an integrated circuit die packaged within the processor 1104. In some embodiments, the integrated circuit die of the processor includes onboard circuitry that is implemented with one or more integrated circuit structures or devices (e.g., one or more memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1106 also may include an integrated circuit die packaged within the communication chip 1106. In accordance with some such example embodiments, the integrated circuit die of the communication chip includes one or more integrated circuit structures or devices (e.g., one or more memory cells) formed using the disclosed techniques as variously described herein. As will be appreciated in light of this disclosure, note that multi-standard wireless capability may be integrated directly into the processor 1104 (e.g., where functionality of any chips 1106 is integrated into processor 1104, rather than having separate communication chips). Further note that processor 1104 may be a chip set having such wireless capability. In short, any number of processor 1104 and/or communication chips 1106 can be used. Likewise, any one chip or chip set can have multiple functions integrated therein.

In various implementations, the computing device 1100 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more memory cells) formed using the disclosed techniques, as variously described herein.

Further Example Embodiments

The following examples pertain to further embodiments, from which numerous permutations and configurations will be apparent.

Example 1 is an integrated circuit including: a backend thin-film transistor (TFT) having a gate electrode, source and drain regions, a semiconductor region between and physically connecting the source and drain regions, and a gate dielectric between the gate electrode and the semiconductor region; and a ferroelectric capacitor electrically connected to the backend TFT and having a first terminal electrically connected to one of the source and drain regions, a second terminal, and a ferroelectric dielectric between the first and second terminals.

Example 2 includes the integrated circuit of Example 1, where the semiconductor region includes one or more of indium gallium zinc oxide (IGZO), indium zinc oxide (IZO), indium tin oxide (ITO), amorphous silicon (a-Si), zinc oxide, polysilicon, poly-germanium, low-temperature polycrystalline silicon (LTPS), amorphous germanium (a-Ge), indium arsenide, copper oxide, and tin oxide.

Example 3 includes the integrated circuit of Example 2, where the semiconductor region includes one or more of IGZO, IZO, a-Si, LTPS, and a-Ge.

Example 4 includes the integrated circuit of any of Examples 1-3, where the gate dielectric includes hafnium dioxide ($HfO_2$).

Example 5 includes the integrated circuit of Example 4, where the gate dielectric has a thickness between 2 and 10 nanometers (nm).

Example 6 includes the integrated circuit of any of Examples 1-5, where the ferroelectric capacitor includes a metal-insulator-metal (MIM) capacitor having a stacked structure.

Example 7 includes the integrated circuit of any of Examples 1-5, where the ferroelectric capacitor includes a metal-insulator-metal (MIM) capacitor having a U-shaped structure.

Example 8 includes the integrated circuit of any of Examples 1-7, where the ferroelectric dielectric includes one or more of lead zirconate titanate (PZT), hafnium zirconium oxide (HZO), barium titanate ($BaTiO_3$), lead titanate (Pb$TiO_3$), and doped hafnium dioxide ($HfO_2$).

Example 9 includes the integrated circuit of Example 8, where the doped $HfO_2$ includes one or more of silicon-doped $HfO_2$, yttrium-doped $HfO_2$, and aluminum-doped $HfO_2$.

Example 10 includes the integrated circuit of any of Examples 1-9, further including a capping layer on the semiconductor region.

Example 11 includes the integrated circuit of Example 10, where the capping layer includes one or more of aluminum oxide, gallium oxide, silicon nitride, silicon dioxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate.

Example 12 includes the integrated circuit of Example 11, where the capping layer includes one or more of aluminum oxide, silicon nitride, titanium dioxide, hafnium dioxide, silicon oxynitride, and aluminum nitride.

Example 13 includes the integrated circuit of any of Examples 10-12, further including source and drain electrodes electrically connected to the source and drain regions, where the capping layer physically connects and electrically separates the source and drain electrodes.

Example 14 is a memory cell including the integrated circuit of any of Examples 1-13, the gate electrode being electrically connected to a wordline, the source region being electrically connected to a bitline, and the drain region being the one of the source and drain regions.

Example 15 includes the memory cell of Example 14, where the backend TFT is electrically connected to a frontend circuit, and the frontend circuit includes a wordline driver electrically connected to the wordline and a sense amplifier electrically connected to the bitline.

Example 16 is an embedded memory including a plurality of wordlines extending in a first direction, a plurality of bitlines extending in a second direction crossing the first direction, and a plurality of memory cells at crossing regions of the wordlines and the bitlines, the memory cells including a first memory cell and a second memory cell, each of the first and second memory cells having a structure of the memory cell of any of Examples 14-15, with the wordline being a corresponding one of the wordlines and the bitline being a corresponding one of the bitlines.

Example 17 includes the embedded memory of Example 16, where the backend TFT is electrically connected to a frontend circuit, and the frontend circuit includes a plurality of wordline drivers electrically connected to the wordlines and a plurality of sense amplifiers electrically connected to the bitlines.

Example 18 is a memory cell including: a backend thin-film transistor (TFT) having a gate electrode electrically connected to a wordline, a source region electrically connected to a bitline, a drain region, a semiconductor region between and physically connecting the source and drain regions, and a gate dielectric between the gate electrode and the semiconductor region; and a ferroelectric capacitor electrically connected to the backend TFT and having a first terminal electrically connected to the drain region, a second terminal, and a ferroelectric dielectric between the first and second terminals.

Example 19 includes the memory cell of Example 18, where the semiconductor region includes one or more of indium gallium zinc oxide (IGZO), indium zinc oxide (IZO), indium tin oxide (ITO), amorphous silicon (a-Si), zinc oxide, polysilicon, poly-germanium, low-temperature polycrystalline silicon (LTPS), amorphous germanium (a-Ge), indium arsenide, copper oxide, and tin oxide.

Example 20 includes the memory cell of Example 19, where the semiconductor region includes one or more of IGZO, IZO, a-Si, LTPS, and a-Ge.

Example 21 includes the memory cell of any of Examples 18-20, where the gate dielectric includes hafnium dioxide (HfO$_2$).

Example 22 includes the memory cell of Example 21, where the gate dielectric has a thickness between 2 and 10 nanometers (nm).

Example 23 includes the memory cell of any of Examples 18-22, where the ferroelectric capacitor includes a metal-insulator-metal (MIM) capacitor having a stacked structure.

Example 24 includes the memory cell of any of Examples 18-22, where the ferroelectric capacitor includes a metal-insulator-metal (MIM) capacitor having a U-shaped structure.

Example 25 includes the memory cell of any of Examples 18-25, where the ferroelectric dielectric includes one or more of lead zirconate titanate (PZT), hafnium zirconium oxide (HZO), barium titanate (BaTiO$_3$), lead titanate (PbTiO$_3$), and doped hafnium dioxide (HfO$_2$).

Example 26 includes the memory cell of Example 25, where the doped HfO$_2$ includes one or more of silicon-doped HfO$_2$, yttrium-doped HfO$_2$, and aluminum-doped HfO$_2$.

Example 27 includes the memory cell of any of Examples 18-26, further including a capping layer on the semiconductor region.

Example 28 includes the memory cell of Example 27, where the capping layer includes one or more of aluminum oxide, gallium oxide, silicon nitride, silicon dioxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate.

Example 29 includes the memory cell of Example 28, where the capping layer includes one or more of aluminum oxide, silicon nitride, titanium dioxide, hafnium dioxide, silicon oxynitride, and aluminum nitride.

Example 30 includes the memory cell of any of Examples 27-29, further including source and drain electrodes electrically connected to the source and drain regions, where the capping layer physically connects and electrically separates the source and drain electrodes.

Example 31 includes the memory cell of any of Examples 18-30, where the backend TFT is electrically connected to a frontend circuit, and the frontend circuit includes a wordline driver electrically connected to the wordline and a sense amplifier electrically connected to the bitline.

Example 32 is an embedded memory including a plurality of wordlines extending in a first direction, a plurality of bitlines extending in a second direction crossing the first direction, and a plurality of memory cells at crossing regions of the wordlines and the bitlines, the memory cells including a first memory cell and a second memory cell, each of the first and second memory cells having a structure of the memory cell of any of Examples 18-30, with the wordline being a corresponding one of the wordlines and the bitline being a corresponding one of the bitlines.

Example 33 includes the embedded memory of Example 32, where the backend TFT is electrically connected to a frontend circuit, and the frontend circuit includes a plurality of wordline drivers electrically connected to the wordlines and a plurality of sense amplifiers electrically connected to the bitlines.

Example 34 is a method of fabricating an integrated circuit, the method including: forming a backend thin-film transistor (TFT), the backend TFT having a gate electrode, source and drain regions, a semiconductor region between and physically connecting the source and drain regions, and a gate dielectric between the gate electrode and the semiconductor region; and forming a ferroelectric capacitor, the ferroelectric capacitor having a first terminal electrically connected to one of the source and drain regions, a second terminal, and a ferroelectric dielectric between the first and second terminals.

Example 35 includes the method of Example 34, where the semiconductor region includes one or more of indium gallium zinc oxide (IGZO), indium zinc oxide (IZO), indium tin oxide (ITO), amorphous silicon (a-Si), zinc oxide, poly-silicon, poly-germanium, low-temperature polycrystalline silicon (LTPS), amorphous germanium (a-Ge), indium arsenide, copper oxide, and tin oxide.

Example 36 includes the method of Example 35, where the semiconductor region includes one or more of IGZO, IZO, a-Si, LTPS, and a-Ge.

Example 37 includes the method of any of Examples 34-36, where the gate dielectric includes hafnium dioxide (HfO$_2$).

Example 38 includes the method of Example 37, where the gate dielectric has a thickness between 2 and 10 nanometers (nm).

Example 39 includes the method of any of Examples 34-38, where the ferroelectric capacitor includes a metal-insulator-metal (MIM) capacitor having a stacked structure.

Example 40 includes the method of any of Examples 34-38, where the ferroelectric capacitor includes a metal-insulator-metal (MIM) capacitor having a U-shaped structure.

Example 41 includes the method of any of Examples 34-40, where the ferroelectric dielectric includes one or more of lead zirconate titanate (PZT), hafnium zirconium oxide (HZO), barium titanate (BaTiO$_3$), lead titanate (PbTiO$_3$), and doped hafnium dioxide (HfO$_2$).

Example 42 includes the method of Example 41, where the doped HfO$_2$ includes one or more of silicon-doped HfO$_2$, yttrium-doped HfO$_2$, and aluminum-doped HfO$_2$.

Example 43 includes the method of any of Examples 34-42, further including forming a capping layer on the semiconductor region.

Example 44 includes the method of Example 43, where the capping layer includes one or more of aluminum oxide, gallium oxide, silicon nitride, silicon dioxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate.

Example 45 includes the method of Example 44, where the capping layer includes one or more of aluminum oxide, silicon nitride, titanium dioxide, hafnium dioxide, silicon oxynitride, and aluminum nitride.

Example 46 includes the method of any of Examples 43-45, further including forming source and drain electrodes electrically connected to the source and drain regions, where the capping layer physically connects and electrically separates the source and drain electrodes.

Example 47 is a method of fabricating a memory cell, the method including: fabricating the integrated circuit by the method of any of Examples 34-46; electrically connecting the gate electrode to a wordline; and electrically connecting the source region to a bitline, where the drain region is the one of the source and drain regions.

Example 48 includes the method of Example 47, where the backend TFT is electrically connected to a frontend circuit, the method further including: forming a wordline driver as part of the frontend circuit; forming a sense amplifier as part of the frontend circuit; electrically connecting the wordline driver to the wordline; and electrically connecting the sense amplifier to the bitline.

Example 49 is a method of fabricating an embedded memory, the method including: forming a plurality of wordlines extending in a first direction; forming a plurality of bitlines extending in a second direction crossing the first direction; and forming a plurality of memory cells at crossing regions of the wordlines and the bitlines, the memory cells including a first memory cell and a second memory cell, each of the first and second memory cells being fabricated by the method of any of Examples 47-48, with the wordline being a corresponding one of the wordlines and the bitline being a corresponding one of the bitlines.

Example 50 includes the method of Example 49, where the backend TFT is electrically connected to a frontend circuit, the method further including: forming a plurality of wordline drivers as part of the frontend circuit; forming a plurality of sense amplifiers as part of the frontend circuit; electrically connecting the wordline drivers to the wordlines; and electrically connecting the sense amplifiers to the bitlines.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
  a backend thin-film transistor (TFT) having a gate electrode, source and drain regions, a semiconductor region between and physically connecting the source and drain regions along a direction from the source region to the drain region, and a gate dielectric between the gate electrode and the semiconductor region, wherein the gate electrode is a bottom gate electrode, the bottom gate electrode extending laterally beyond outermost sides of the source and drain regions along the direction from the source region to the drain region, and the bottom gate electrode extending laterally beyond outermost sides of the gate dielectric along the direction from the source region to the drain region; and
  a ferroelectric capacitor electrically connected to the backend TFT and having a first terminal electrically connected to one of the source and drain regions, a second terminal, and a ferroelectric dielectric between the first and second terminals.

2. The integrated circuit of claim 1, wherein the semiconductor region comprises one or more of indium gallium zinc oxide (IGZO), indium zinc oxide (IZO), indium tin oxide (ITO), amorphous silicon (a-Si), zinc oxide, polysilicon, poly-germanium, low-temperature polycrystalline silicon (LTPS), amorphous germanium (a-Ge), indium arsenide, copper oxide, and tin oxide.

3. The integrated circuit of claim 2, wherein the semiconductor region comprises one or more of IGZO, IZO, a-Si, LTPS, and a-Ge.

4. The integrated circuit of claim 1, wherein the gate dielectric comprises hafnium dioxide ($HfO_2$).

5. The integrated circuit of claim 4, wherein the gate dielectric has a thickness between 2 and 10 nanometers (nm).

6. The integrated circuit of claim 1, wherein the ferroelectric capacitor comprises a metal-insulator-metal (MIM) capacitor having a stacked structure.

7. The integrated circuit of claim 1, wherein the ferroelectric capacitor comprises a metal-insulator-metal (MIM) capacitor having a U-shaped structure.

8. The integrated circuit of claim 1, wherein the ferroelectric dielectric comprises one or more of lead zirconate titanate (PZT), hafnium zirconium oxide (HZO), barium titanate ($BaTiO_3$), lead titanate ($PbTiO_3$), and doped hafnium dioxide ($HfO_2$).

9. The integrated circuit of claim 8, wherein the doped $HfO_2$ comprises one or more of silicon-doped $HfO_2$, yttrium-doped $HfO_2$, and aluminum-doped $HfO_2$.

10. The integrated circuit of claim 1, further comprising a capping layer on the semiconductor region.

11. The integrated circuit of claim 10, wherein the capping layer comprises one or more of aluminum oxide, gallium oxide, silicon nitride, silicon dioxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate.

12. The integrated circuit of claim 11, wherein the capping layer comprises one or more of aluminum oxide, silicon nitride, titanium dioxide, hafnium dioxide, silicon oxynitride, and aluminum nitride.

13. The integrated circuit of claim 10, further comprising source and drain electrodes electrically connected to the source and drain regions, wherein the capping layer physically connects and electrically separates the source and drain electrodes.

14. A memory cell comprising the integrated circuit of claim 1, wherein the gate electrode is electrically connected to a wordline, the source region is electrically connected to a bitline, and the drain region is one of the source and drain regions.

15. The memory cell of claim 14, wherein the backend TFT is electrically connected to a frontend circuit, and the frontend circuit comprises a wordline driver electrically connected to the wordline and a sense amplifier electrically connected to the bitline.

16. An embedded memory comprising:
  a plurality of wordlines extending in a first direction; a plurality of bitlines extending in a second direction crossing the first direction; and
  a plurality of memory cells at crossing regions of the wordlines and the bitlines, wherein one or more of the plurality of memory cells comprises a backend thin-film transistor (TFT) having a gate electrode, source and drain regions, a semiconductor region between and physically connecting the source and drain regions along a direction from the source region to the drain region, and a gate dielectric between the gate electrode and the semiconductor region, wherein the gate electrode is a bottom gate electrode, the bottom gate electrode extending laterally beyond outermost sides of the source and drain regions along the direction from the source region to the drain region, and the bottom gate electrode extending laterally beyond outermost sides of the gate dielectric along the direction from the source region to the drain region; and a ferroelectric capacitor electrically connected to the backend TFT and having a first terminal electrically connected to one of the source and drain regions, a second terminal, and a ferroelectric dielectric between the first and second terminals.

17. The embedded memory of claim 16, wherein the backend TFT is electrically connected to a frontend circuit, and the frontend circuit comprises a plurality of wordline drivers electrically connected to the plurality of wordlines and a plurality of sense amplifiers electrically connected to the plurality of bitlines.

18. A method of fabricating an integrated circuit, the method comprising:

forming a backend thin-film transistor (TFT), the backend TFT having a gate electrode, source and drain regions, a semiconductor region between and physically connecting the source and drain regions along a direction from the source region to the drain region, and a gate dielectric between the gate electrode and the semiconductor region, wherein the gate electrode is a bottom gate electrode, the bottom gate electrode extending laterally beyond outermost sides of the source and drain regions along the direction from the source region to the drain region, and the bottom gate electrode extending laterally beyond outermost sides of the gate dielectric along the direction from the source region to the drain region; and forming a ferroelectric capacitor, the ferroelectric capacitor having a first terminal electrically connected to one of the source and drain regions, a second terminal, and a ferroelectric dielectric between the first and second terminals.

19. The method of claim 18, wherein the ferroelectric capacitor comprises a metal-insulator-metal (MIM) capacitor having a stacked structure.

20. The method of claim 18, wherein the ferroelectric capacitor comprises a metal-insulator-metal (MIM) capacitor having a U-shaped structure.

* * * * *